United States Patent
Fukuhisa et al.

(10) Patent No.: US 7,132,373 B2
(45) Date of Patent: Nov. 7, 2006

(54) THIN METAL OXIDE FILM AND PROCESS FOR PRODUCING THE SAME

(75) Inventors: Koji Fukuhisa, Kanagawa (JP); Akira Nakajima, Kanagawa (JP); Kenji Shinohara, Kanagawa (JP); Toshiya Watanabe, Kanagawa (JP); Hisashi Ohsaki, Kanagawa (JP); Tadashi Serikawa, Tokyo (JP)

(73) Assignees: Toto Ltd., Fukuoka (JP); The University of Tokyo, Tokyo (JP)

( * ) Notice: Subject to any disclaimer, the term of this patent is extended or adjusted under 35 U.S.C. 154(b) by 0 days.

(21) Appl. No.: 10/491,527

(22) PCT Filed: Sep. 30, 2002

(86) PCT No.: PCT/JP02/10181

§ 371 (c)(1),
(2), (4) Date: Jun. 10, 2004

(87) PCT Pub. No.: WO03/031673

PCT Pub. Date: Apr. 17, 2003

(65) Prior Publication Data

US 2004/0241976 A1    Dec. 2, 2004

(30) Foreign Application Priority Data

Oct. 2, 2001   (JP)  ............................ 2001-306174
Mar. 20, 2002  (JP)  ............................ 2002-077919

(51) Int. Cl.
*H01L 21/469* (2006.01)
(52) U.S. Cl. ........................ 438/778; 438/785; 438/798
(58) Field of Classification Search ................ 438/778, 438/785, 795, 798
See application file for complete search history.

(56) References Cited

U.S. PATENT DOCUMENTS

| 5,593,737 | A | * | 1/1997 | Meinzer et al. ............. 427/512 |
| 5,631,664 | A | * | 5/1997 | Adachi et al. ............. 345/74.1 |
| 6,378,153 | B1 | * | 4/2002 | Morgan ..................... 257/310 |
| 6,432,725 | B1 | | 8/2002 | Lian et al. |
| 2002/0063537 | A1 | * | 5/2002 | Nam et al. ............... 315/169.4 |
| 2003/0218153 | A1 | * | 11/2003 | Abe .......................... 252/500 |

FOREIGN PATENT DOCUMENTS

| JP | 401069512 A | * 3/1989 |
| JP | 2-283022 A | 11/1990 |
| JP | 4-149090 A | 5/1992 |
| JP | 4-199828 | 7/1992 |
| JP | 06-172990 A | 6/1994 |
| JP | 07-086165 A | 3/1995 |
| JP | 07-224384 A | 8/1995 |

(Continued)

*Primary Examiner*—Mary Wilczewski
*Assistant Examiner*—Toniae M. Thomas
(74) *Attorney, Agent, or Firm*—Birch, Stewart, Kolasch & Birch, LLP

(57) ABSTRACT

The present invention provides a method for producing a crystalline metal oxide thin film by first depositing a substantially amorphous metal oxide film, and thereafter, as a post treatment, exposing the film to low temperature plasma in a high frequency electric field at 180° C. or less, and the crystalline metal oxide thin film produced by this method. Because the producing method according to the present invention allows a dense and homogenous crystalline metal oxide thin film to be formed onto a substrate at a low temperature without requiring active heat treatment, a metal oxide thin film having desirable characteristics can be formed without damaging the characteristics of a substrate even if the substrate has comparatively low heat resistance.

14 Claims, 11 Drawing Sheets

FOREIGN PATENT DOCUMENTS

| | | |
|---|---|---|
| JP | 7-294861 A | 11/1995 |
| JP | 9-64307 A | 3/1997 |
| JP | 9-153491 A | 6/1997 |
| JP | 9-246477 A | 9/1997 |
| JP | 9-262466 A | 10/1997 |
| JP | 10-233489 A | 9/1998 |
| JP | 10-273317 A | 10/1998 |
| JP | 11-145148 A | 5/1999 |
| JP | 2000-86242 A | 3/2000 |
| JP | 2000-200899 A | 7/2000 |
| JP | 2001-31681 A | 2/2001 |
| JP | 2001-85639 A | 3/2001 |
| JP | 2001-133466 A | 5/2001 |
| JP | 2001-148377 A | 5/2001 |
| JP | 2001-152339 A | 6/2001 |

* cited by examiner (A)

(B)

(C)

(A)

(B)

(C)

(A)

Untreated film (B)

Plasma treatment for 3 minutes (C)

Plasma treatment for 10 minutes (A)

Sample crystallized by burning (B)

Sample crystallized by plasma

THIN METAL OXIDE FILM AND PROCESS FOR PRODUCING THE SAME

TECHNICAL FIELD

The present invention relates to a metal oxide thin film and a producing method thereof. In particular, the present invention generally relates to a technique for forming a crystalline metal oxide thin film onto a substrate without requiring heat treatment.

BACKGROUND ART

Forming a metal oxide film onto a substrate such as glass, a polymer or a semiconductor by sputtering or vacuum evaporation has been carried out in the past. In recent years, for reasons of reducing deposition costs and manufacturing large-scale products, there has been a trend towards increasingly larger areas which can be formed at one time. There has also been a steadily growing trend towards using resin substrates (for example, use of polycarbonate or acrylic) in place of glass as a substrate. With this move towards deposition of larger deposited film surface areas and non-heat resistant substrates, deposition that does not require heating is being widely carried out because deposition technologies that do heat the substrate cause the film to crack or damage the substrate.

However, in such a non-heating process, driving force and mobility for crystallization of the metal oxide is not supplied sufficiently. This means that the obtained film tends to be amorphous, making it difficult to achieve sufficient crystallinity. For that reason, in a case where a surface crystallinity greatly effects the characteristics of a product, it has been necessary to strictly control process conditions such as gas introduction. However, if such strict control of process conditions is required, it is often the case that the obtained film characteristics are inferior to those of films which were produced by a process which involves heat treatment of the substrate, even when it was thought that the process was comparatively successful.

One approach to reduce the extent of heating the substrate that has been widely used is to prepare an oxide film using a precursor solution containing an ion which comprises a metal element. Such a precursor solution includes a metal alkoxide, metal acetate, organic-metal complex, metal salt, metal soap and the like. A typical deposition method that uses these substances is a sol-gel method which uses a metal alkoxide solution. These deposition methods use water and a catalyst such as an acid for a solution containing an ion which comprises a metal element, wherein the ion comprising a metal element is made to transit from a low molecular state to a high molecular state, which is disorderly but has the molecules bonding to each other (this state is called gelation). At this stage heat is applied to remove organic substances at a comparatively low temperature, whereby a metal oxide can be obtained. Because this method has low equipment costs, and through dip coating or the like allows uniform deposition over an entire substance even for objects having an intricate shape, it is suitable for coating of thin film oxides for high-mix low-volume production or comparatively small objects. However, such a method has the drawback that it can only be applied to heat resistant substrates, because generally heat treatment of at least 400° C. is required for the combustion of organic material contained in the source solution, dehydration polycondensation inside the film or to promote crystallization.

Methods such as ultraviolet irradiation, steaming and electron beam irradiation are being investigated for these sol-gel process films as a technique for accelerating crystallization and densification without requiring heat treatment. Recently, Rengakuji of Toyama University (Japan) has reported that the addition of an aromatic compound such as benzene to a metal alkoxide allows the molecules in the alkoxide to be sandwiched by the benzene, and that a structure advantageous to crystallization can be formed by depositing it so as to make crystallization at a low temperature more easily carried out. However, this process also requires strict control process conditions similar to those mentioned above for the non-heat treatment processes. There are disadvantages such as insufficient repeatability and insufficient crystallization.

In view of the background described above, a technique for forming an amorphous metal oxide film on a substrate with low heat resistance such as a resin material and effectively crystallizing the film without deteriorating the substrate was extremely limited. In particular, there was almost no technique for sufficiently crystallizing an amorphous film simultaneously and uniformly over an entire object in a short period of time.

Highly advanced techniques for thin films using plasma which pertains to the present invention include Japanese Patent Laid-Open No. 4-149090, U.S. Pat. No. 6,432,725, Japanese Patent Laid-Open No. 07-294861, Japanese Patent Laid-Open No. 04-199828, Japanese Patent Laid-Open No. 2001-148377, Japanese Patent Laid-Open No. 2001-31681, Japanese Patent Laid-Open No. 2001-133466, Japanese Patent Laid-Open No. 09-64307, Japanese Patent Laid-Open No. 10-233489, Japanese Patent Laid-Open No. 2000-200899, Japanese Patent Laid-Open No. 09-153491, Japanese Patent Laid-Open No. 09-246477, Japanese Patent Laid-Open No. 2001-152339, Japanese Patent Laid-Open No. 10-273317, Japanese Patent Laid-Open No. 09-262466, Japanese Patent Laid-Open No. 2001-85639, Japanese Patent Laid-Open No. 2000-86242, Japanese Patent Laid-Open No. 02-283022 and Japanese Patent Laid-Open No. 11-145148. The main differences between what is disclosed in these techniques and the present invention will be described below.

DISCLOSURE OF THE INVENTION

It is an object of the present invention to provide a technique for effectively forming a dense and homogenous crystalline metal oxide film onto a substrate at a low temperature and without requiring active heat treatment in order to resolve the above-mentioned problems in the art.

It becomes possible to obtain a dense and homogeneous film having a larger surface area than previously and combining excellent surface activity and strength if a means for restoring defects is conducted to a formed film with the film temperature being kept comparatively low and without active heat treatment. Further, as a microfabrication technique such as integrated circuit processes becomes more advanced, defects in electrodes and oxide films occur more easily. This means that processes with little thermal history become more important. After extensive researches on techniques which satisfies the demand to overcome these defects, the present inventors have found that effective method which involves exposing a substantially amorphous metal oxide film prepared at room temperature to low temperature plasma under specific conditions without performing active heating.

Namely, according to the present invention, there is provided a producing method of a metal oxide thin film comprising the step of exposing a substantially amorphous metal oxide film to low temperature plasma in a high-frequency electric field at 180° C. or less so as to produce a crystalline metal oxide thin film. In other words, the present method is a method for producing a crystalline metal oxide thin film by first depositing a substantially amorphous metal oxide film, and thereafter, as post processing separate from the deposition, conducting low temperature plasma processing to the substantially amorphous metal oxide film without heating, in particular at or below 180° C., in a high-frequency electric field.

This method for producing a metal oxide thin film includes cases where the above crystalline metal oxide thin film consists of a substantially crystalline metal oxide thin film, In this regard, "a substantially crystalline metal oxide thin film" means a state where the film has a portion of crystallinity to an extent that the film is considered to have crystallinity by an X-ray diffraction pattern although an amorphous portion may also be present in the film.

Further, in the above method for producing a metal oxide thin film, it is preferable that the relative density of the crystalline metal oxide thin film compared to the theoretical density thereof be 90% or more. That is, according to the present invention, a film having a high density can be formed.

It is also preferable that high frequency plasma be used for the above-mentioned low temperature plasma.

As preferable conditions for generating the low-temperature high-frequency plasma, the applied frequency is in the range of 1 kHz to 300 MHz, the pressure is 5 Pa or more, and the supplied power is 300 W or more, for example.

In addition, the above plasma is preferably plasma generated by exciting gas which comprises at least oxygen gas or oxygen element. Alternatively, in cases where the above metal oxide film is a film whose properties are imparted by the deficiency of oxygen, the above low temperature plasma is preferably plasma generated by exciting at least argon gas or nitrogen gas, or gas comprised thereof.

A variety of methods are possible for the deposition method for the metal oxide film substantially consisting of an amorphous material, including a sputtering method, an ion plating method, and a vacuum evaporation method. Alternatively, the metal oxide film substantially consisting of an amorphous material can be formed by application of a precursor solution, that is, a wet deposition. In the latter case, the above-mentioned metal oxide film substantially consisting of an amorphous material formed by applying a precursor solution may also be pretreated by ultraviolet light irradiation in the presence of water vapor prior to exposing to plasma.

The metal oxide film substantially consisting of an amorphous material according to the present invention is, for example, a film containing titanium oxide, film containing ITO, film containing lead zirconate titanate (PZT) and the like.

The metal oxide film according to the present invention comprises a crystalline metal oxide thin film formed using a method as mentioned above.

The metal oxide film according to the present invention can be applied to various structures, materials, or parts. For example, a structure can be configured such that the above crystalline metal oxide thin film is formed onto a non-heat resistant substrate (for example, the above-mentioned resin substrate having comparatively low heat resistance) without providing a heat barrier layer. In addition, an image display device can be configured such that the above crystalline metal oxide thin film is formed as a surface layer and/or an internal layer. A photocatalytic material can also be configured such that the above crystalline metal oxide thin film is formed as a surface layer and/or an internal layer. Furthermore, an electronic device can be configured such that the above crystalline metal oxide thin film is formed as a surface layer and/or an internal layer.

BEST MODE FOR CARRYING OUT THE INVENTION

Figure 1:
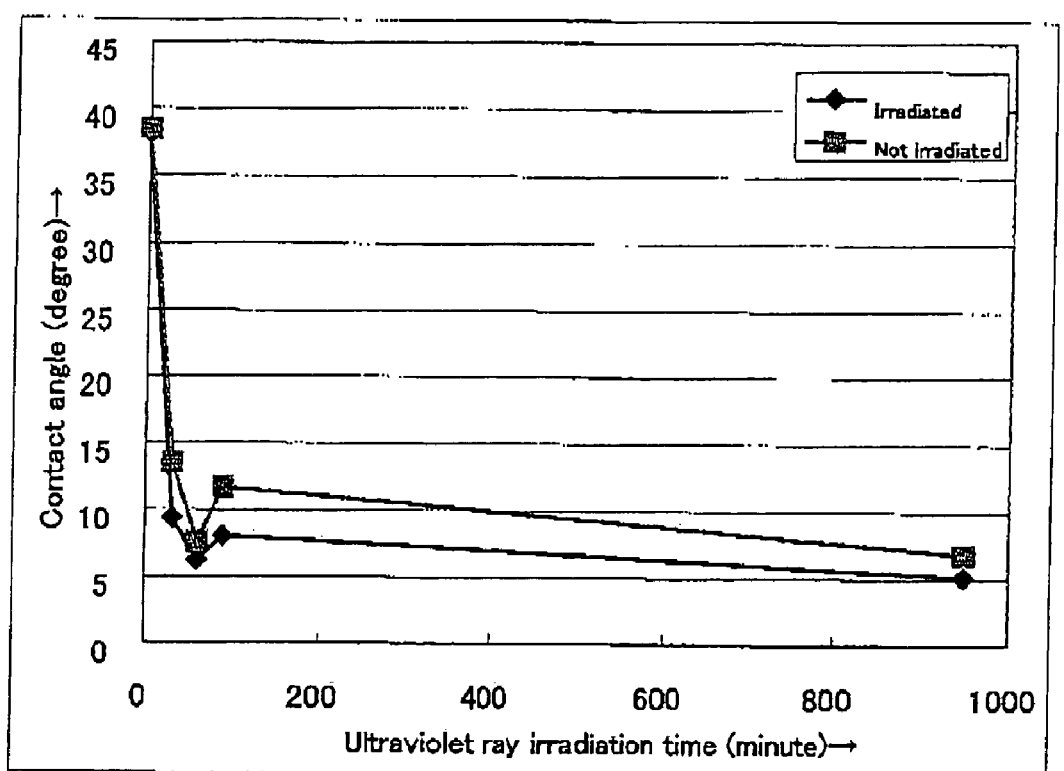
FIG. 1 shows a relationship between ultraviolet irradiation time and contact angle, which shows the effect of hydrophilicity when oxygen plasma treatment is carried out on a sputtered film.

The present invention will now be described along with desirable embodiments of the invention.

Basically, the method for producing a metal oxide thin film according to the present invention is a method which forms a substantially amorphous metal oxide film, and changes the above-mentioned film to a crystalline metal oxide thin film by exposing to low temperature plasma in a high frequency electric field at a temperature below 180° C. without conducting active heating to the substrate. The present invention basically aims at depositing a crystalline metal oxide thin film on a substrate having comparatively low heat resistance, which is based on plasma processing at a temperature of 180° C. or less. Because the substrate does not need to be heated to a high temperature, disadvantages caused by high temperature heating can be completely avoided.

Detailed examination of the conditions for producing a metal oxide thin film according to the present invention led to the discovery that exposing a substantially amorphous oxide film to low temperature plasma, which is generated at a suitable frequency, supplied power and gas pressure, in a high frequency electric field achieves sufficient and homogenous density and crystallinity for a large number of materials.

In the present invention, a substantially amorphous metal oxide film refers to a film in which an X-ray detectable crystal structure is not in an orderly state. Specifically, it means an oxide film which has no significant peaks in an X-ray diffraction pattern. In addition, a substantially amorphous metal oxide film includes oxide films containing fine particles having a certain amount of a crystal structure.

In the present invention, a crystalline metal oxide thin film is determined by its X-ray diffraction pattern. Crystallization in the present invention refers to formation and growth from an amorphous or substantially amorphous state into a significant crystal structure which is determined by X-rays. Also, as mentioned above, a "substantially crystalline metal oxide thin film" refers to a state where the film contains a portion having crystallinity to an extent that the thin film is considered to have crystallinity by an X-ray diffraction pattern, while an amorphous portion is also contained in the film.

"Densification" in the present invention is considered to be achieved when the density of the obtained oxide film is 90% or more with respect to the theoretical density which is generally given as physical properties of an oxide. This relative density is determined by film mass or a refractive index based on ellipsometry and UV-VIS-IR spectrum.

The producing technique of the present invention can be applied to, in particular, materials which are have problems with degradation by heat, breakage, substrate-film reaction, or mutual diffusion between elements contained in the substrate and the film because a crystalline metal oxide can be formed at a relatively low temperature. As will be illustrated by the following examples, the producing technique of the present invention can be used to produce various device members which require forming a fine structure over a large surface area because it is possible to form a film with extreme homogeneity and with no defects such as pinholes etc, even in batch-treatment for a large surface area. Specifically, the producing technique of the present invention can be applied to thin layered capacitors such as multi layer ceramic capacitors and microcapacitors used inside semiconductor devices, and transparent electrodes used in image display devices such as plasma displays or liquid crystal displays.

In addition, the producing technique of the present invention can be used as a post treatment method for a titanium oxide film formed by large-area high-speed film formation because a crystalline titanium oxide having photocatalytic activity can be formed at an extremely low temperature, as will be illustrated in the following examples.

Accordingly, the crystalline metal oxide thin film formed in accordance with the present invention is expected to be applied in a wide range of products and technology fields, such as filters, delay lines, capacitors, thermistors, oscillators, piezoelectric device parts, thin film substrates, memories, circuit overcoat materials, VCOs (voltage control oscillator), hybrid ICs, EMC devices, mobile phones, devices mounted in a vehicle (ETC, audio, navigation etc.), LANs, PDPs (plasma display panels); liquid crystal displays, various audio players (CD, MD etc.), DVDs, electrode materials, window glass, eye glasses, goggles, helmets, skies, surfboards, microscopes, preparations, cover glass, multi layered substrates, solar batteries, fluorescent lamps, lamps, lighting instruments, tents, tile, transparent films, cards, mirrors, telephones, sign boards, computers, sashes, fans, ventilation fans, sanitary ware, video cameras, medical equipments, stomach cameras, sunglasses, signals, bicycles, speakers, antennas, eating utensils, air conditioners, washing machines, motorbikes, boats and torches.

Now, conditions for the low temperature plasma treatment according to the present invention will be described in detail. Low temperature plasma is thermally unbalanced plasma whose electron temperature is much higher than the temperature of ions and neutral particles, and generated at a gas pressure of several hundreds Pa or less as a general rule. The frequency of the applied AC electric field is preferably between 1 kHz to 300 MHz to prevent gas discharge and thermal plasma from being generated. More preferably, the frequency of 13.56 MHz is suitable, which has been allotted for industrial use and used for existing devices. It is preferable that the high frequency used for plasma generation be also used for the high-frequency electric field of the present invention.

A suitable power supply is 300 W or more for the size of the devices used in the following examples, for instance. However, because the suitable power supply depends on the size of the plasma generating device, treatment using a small power supply is suitable in a case of using a chamber having a small volume. Converted into a supplied power density per unit volume in the space where plasma is generated using the chamber of the following examples, 300 W is about $1.97 \times 10^4$ $Wm^{-3}$. It is possible to determine how much power needs to be supplied using this power per unit volume.

Oxygen, argon, nitrogen or a combination thereof may be used for plasma generation. A total pressure of 5 Pa or more is preferable, and 50 Pa or more is more preferable. As illustrated in the examples, for many oxides, plasma treatment using oxygen gas having a purity of 99.9% or more is preferable because their properties is stable under such a condition. In this instance, as low temperature plasma, plasma generated by exciting at least oxygen gas or gas containing oxygen elements can be used. However, in a case of an oxide film whose characteristics are imparted or limited by oxygen deficiency, other gas such as argon or nitrogen can be used in place of oxygen, and as low temperature plasma, plasma generated by exciting at least argon gas or nitrogen gas, or gas containing such gas can be used.

With regard to the plasma treatment time, exposing a substantially amorphous metal oxide film to plasma for up to 3 minutes is sufficient to obtain a film which has crystallinity to an extent where it shows a non-zero X-ray diffraction pattern, or to obtain a film which includes microcrystals. However, exposure for up to 10 minutes is more preferable to form an oxide film of desirable crystallinity whose half-width of an X-ray diffraction pattern peak is 0.5 or less.

While the above process may look somewhat similar to sputtering, it is preferable to use vacuum equipments that can generate plasma by applying high frequency power between capacitive-coupling type opposed electrodes without using magnets and without accelerating the charged particles in the plasma. Either one or both of the electrodes for applying the electric field can be exposed within the chamber where the plasma is generated, or can be located outside of the chamber. The equipments differs from an ordinary sputtering device in that high density plasma does not concentrate with respect to the opposed electrode and thereby generation of uniform plasma can be achieved because a converging magnet is not used for the opposed electrode (the electrode on the side of a target in a sputtering device). A physical cut phenomenon as occurs in sputtering does not easily occur, and highly reactive oxygen ions can be easily obtained. An inductively-coupled plasma device, which has higher density plasma than that of a capacitive-coupling type device, can also be used in the present invention. Additionally, in terms of equipments, commercially available devices such as a plasma reactor and a reactive ion etching device may also be used.

These devices do not employ a magnetic field in the electrode, and can generate highly reactive uniform plasma as mentioned above. The effects of this plasma irradiation depend on conditions such as amplification power and gas flow rate. By this treatment, it is possible to uniformly form a metal oxide thin film having excellent mechanical properties such as crystallinity, substrate adhesiveness, film hardness and the like from a suitable amorphous oxide film without heating.

As a substrate on which a substantially amorphous metal oxide film to be exposed to plasma is formed, any substrate can be used as far as it is possible to form a substantially amorphous metal oxide film on such a substrate. In particular, as is described in the following Example 9, a low heat resistant resin substrate can be used in the present invention because the temperature of the substrate and the substantially amorphous metal oxide film does not exceed 90° C. during the crystallization of the substantially amorphous metal oxide film deposited on the substrate.

The coating method for the substantially amorphous metal oxide film is not limited to a particular one. Examples of this method include sputtering, vapor deposition, or spin coating, dip coating, flow coating or bar coating of a precursor solution containing ions comprising a metal element such as a metal alkoxide, metal acetate, organic-metal complex, metal salt, and metal soap. Thus, the present invention can form a crystalline metal oxide thin film by coating a substantially amorphous metal oxide film with dip coating or the like and thereafter exposing the coated film to predetermined plasma even in a case of having an irregular shape.

The precursor solution may be an alkoxide, or may also be an inorganic acid or an organic acid which contains various kinds of metal constituents. The precursor solution does not require prior control of the solution structure which has been proposed by Rengakuji. However, for a precursor solution such as an alkoxide containing a large amount of organic substances, because the film is easily cracked in a case where the thickness of a film formed at one time becomes thick, it is preferable to control the process conditions so that the film thickness is 200 nm or less after deposition. When a thicker film needs to be formed, it is preferable to repeat the process.

For coating carried out by applying the precursor, organic substances are mixed in the formed film. Although the organic substances art automatically decomposed by exposing to plasma, it is preferable to remove the organic substances and carry out sufficient hydrolysis of the precursor in advance so as to obtain a homogenous metal oxide thin film having good crystallinity in a shorter treatment time. More preferably, the effects achieved by exposure to plasma is increased by irradiating for a predetermined period of time with ultraviolet rays having a frequency of 300 nm or less in an atmosphere containing water vapor before exposure to plasma.

There is no active heating of the substrate during the process in the present invention. Although the substrate temperature may be increased due to heat exchange from the plasma atmosphere during exposure to low temperature plasma, this depends on the amplification power and the substrate. It will be clear from the following examples that throughout the process the substrate temperature was about 80° C. for a treatment time of up to 3 minutes, and did not exceed 180° C. even in a case of being processed for 10 minutes. In particular, in the example (Example 9) where a PET substrate which is a non heat resistant substrate, was used, the temperature during treatment did not exceed 90° C. clearly. Thus, during formation of a metal oxide thin film on the substrate, the present invention does not need a barrier layer for preventing the film from being damaged by thermal shock, or prevent the oxide film from reacting with the substrate.

In the present invention, the entire material is uniformly treated. Compared with a scanning type treatment such as laser annealing, the present invention proceeds with extremely homogenous crystallization because the plasma and the high frequency electric field can be operated simultaneously over the entire metal oxide film. Thus, as illustrated in the following Example 7, an extremely thin film of about 100 nm can be crystallized uniformly and with high quality over a large surface area. Also, because the present invention does not induce thermal distribution different from lamp annealing, cracks due to thermal stress hardly occur. This also enables reduction in the number of the processes and the costs with respect to formation of an intermediate layer for relieving stress.

As explained above, the technique according to the present invention is not a technique that uses a phenomena caused by the heat effects from plasma. As mentioned above, there are a lot of related art materials which are similar to the present invention relating to highly advanced techniques for thin films using plasma. In order to differentiate the present invention and such related art materials, the present invention and the related art materials will be compared hereinafter.

Japanese Patent Laid-Open No. 04-149090 discloses a method for producing a crystalline dielectric thin film by forming an amorphous thin film by a sol-gel process with lithium alkoxides and niobium alkoxides, or lithium alkoxides and tantalum alkoxides, and annealing the formed film with high-frequency plasma or electron beams. However, this disclosure uses the term "annealing" which is also known as "tempering" and there is a description in the specification that "although heat treatment by a heater is common, the substrate on which the thin film is formed is also heated while the thin film is heated in this method, which causes problems that the material of the substrate is limited to a heat resistant material or part of the composition is diffused". This technique is directed to local heating using high frequency plasma or electron beams, which is basically different from the present invention. Further, there is no mention in the examples of the experimental conditions to distinguish the plasma such as gas pressure etc, which is insufficient.

U.S. Pat. No. 6,432,725 discloses a method for forming a crystalline dielectric layer which deposits an amorphous metal oxide, and thereafter conducting plasma treatment at a temperature of equal to or less than 400° C. for crystallization. However, as the plasma treatment temperature, only 400° C. is disclosed in the examples, and although around 200° C. is disclosed as a lower temperature limit, this temperature cannot be applied to a substrate having low heat resistance such as resin. Also, the term "anneal" used in the specification refers to "heat treatment". In addition, plasma treatment at 400° C. for 35 seconds is disclosed in the examples. It is impossible to reach to this temperature in a short period of time such as 35 seconds by low temperature plasma of the present invention, which suggests that a step of heating the sample with a heater is added or high temperature plasma is used. Thus, this technique based on heat assistance is essentially different from the present invention.

Japanese Patent Laid-Open No. 07-294861 discloses producing an oxide dielectric thin film by applying a precursor to a substrate and heating in a plasma atmosphere of gas containing at least oxygen elements. This technique is also based on a process of intentionally heating the substrate, making it clearly different from the present invention.

Japanese Patent Laid-Open No. 04-199828 discloses a method for obtaining a high dielectric constant thin film of an oxide by irradiating an oxide film with oxygen ions or oxygen plasma generated using a plasma processing device by plasma separation using microwaves. However, this disclosure does not mention that crystallization of the film to be treated consisting of an amorphous material is achieved, and only states the effect that dielectric pressure becomes higher. Further, 300° C. is used in the examples, which suggests that there is heat assistance.

Japanese Patent Laid-Open No. 2001-148377 discloses a technique for improving characteristics by annealing a dielectric thin film with an ozone generator or a plasma generator. However, this disclosure only mentions improving leakage current characteristics of the film, and does not confirm whether crystallization of an amorphous material occurs or not. Further, since exposure of the dielectric thin film to plasma is performed in a space, which is distant from the place where the plasma is generated and to which a high frequency electric field is not applied, this disclosure is different from the present invention.

Japanese Patent Laid-Open No. 2001-31681 discloses a technique for crystallizing by performing vapor deposition of a lithium transition metal oxide on a substrate as an electrode material, and thereafter conducting plasma treatment to the obtained film. This disclosure is unclear about the definition of an amorphous material, and besides, it is limited to a lithium transition metal oxide. Also, in the examples, the temperature of the substance rises to 391° C. by plasma, and in the section "Disclosure of the Invention", it is disclosed that "heat energy is transmitted by . . . high energy ions colliding with the surface of the thin film in the plasma". This is based on the idea that heat effects from plasma are the main feature of the mechanism, which is clearly different from the present invention.

Japanese Patent Laid-Open No. 2001-133466 discloses a technique for reforming the surface of an ITO film by irradiating the ITO film with oxygen ions or electrons within an energy range of 10–80 eV for the purpose of improving a work function for the ITO film with respect to the physical surface shape (surface roughness) and the crystal surface. However, this disclosure is limited to ITO, and although the starting ITO film is mainly amorphous, there is no mention about crystallization thereof.

Japanese Patent Laid-Open No. 09-64307 discloses a method for supplementing oxygen deficiency of a tantalum oxide film and for reducing leakage current by conducting heat treatment to the tantalum oxide film in an oxidation atmosphere (300° C. to 700° C.), and the tantalum oxide film is irradiated with atomic oxygen in the heat treatment. This disclosure is different from the present invention in that the substance is limited to a tantalum oxide, and heat assists the reaction. Also, this disclosure does not mention crystallizing technique for an amorphous material.

Japanese Patent Laid-Open No. 10-233489 discloses a method for producing a capacitor for a semiconductor device which comprises the steps of forming a capacitor on a semiconductor substrate and exposing the capacitor to plasma. The starting film in this disclosure is also mainly amorphous, but there is no mention of a technique for crystallizing the amorphous material.

Japanese Patent Laid-Open No. 2000-200899 discloses a method for producing a capacitor which has a tantalum oxide film comprising the steps of performing vapor deposition of a tantalum precursor at two-stage temperature, and conducting heat treatment in an oxygen atmosphere with plasma being supplied. The starting film in this disclosure is also mainly amorphous, and there is no mention of a technique for crystallizing the amorphous material.

Japanese Patent Laid-Open No. 09-153491 discloses performing vapor deposition of a tantalum oxide film, and thereafter carrying out plasma-oxygen annealing as annealing at a lower temperature for the purpose of increasing the dielectric constant of tantalum oxide and reducing leakage current. The starting film in this disclosure is also mainly amorphous, and there is no mention of a technique for crystallizing the amorphous material.

Japanese Patent Laid-Open No. 09-246477 discloses a technique for plasma treatment using gas containing nitrogen and oxygen after forming an electrode in order to remove a spontaneous oxide film from a capacitor electrode. The starting film in this disclosure is also mainly amorphous, and there is no mention of a technique for crystallizing the amorphous material.

Japanese Patent Laid-Open No. 2001-152339 discloses a technique for pouring a first reactant containing an element and a ligand to form a thin film into a reaction chamber accommodating a substrate, allowing chemical adsorption onto the substrate, and thereafter adding an activated oxidant. The oxidant is ozone, plasma oxygen and plasma nitrogen oxide. This technique is an Atomic Layer Deposition technique, which is inherently different from the present invention. Also, in this technique, the deposition and the oxidant treatment is carried out in the same chamber. Also, it fails to disclose that the mainly amorphous starting film is crystallized by such oxidant treatment.

Japanese Patent laid-Open No. 10-273317 discloses a method for producing an oxide superconducting thin film by irradiating an oxide thin film which has a thickness of a 1 micron or less and does not show superconductivity with oxidation gas such as ozone, atomic oxygen, an oxygen radical, an oxygen ion or oxygen plasma having strong oxidizing ability than molecular oxygen for a short period of time between 1 minute and 1 hour. The starting film in this disclosure is also mainly amorphous, and there is no mention of a technique for crystallizing the amorphous material.

Japanese Patent Lid-Open No. 09-262466 discloses a method for producing a photocatalytic material by activating the surface of a carrier which comprises titanium oxide wherein the activation is carried out by plasma treatment at 100 to 280° C. According to this disclosure, the transition of a crystal phase from although and Brookite to anatase occurred due to the plasma treatment. However, although the starting film is also mainly amorphous, there is no mention of a technique for crystallizing the amorphous material. This is dearly different from the present invention.

Japanese Patent Laid-Open No. 2001-85639 discloses a technique for conducting oxygen plasma treatment to a dielectric substance. This disclosure carries out plasma treatment after crystallization of the film by heat in order to treat the ends of dangling bonds, which is based on beat treatment of 450° C. or more. This disclosure is clearly different from the present invention.

Japanese Patent Laid-Open No. 2000-86242 discloses a technique for plasma exposure with a sol raw material being supplied so as to obtain a crystallized perovskite thin film. In this disclosure, plasma treatment and deposition are conducted at the same time, which is clearly different from the post treatment of the present invention.

Japanese Patent Laid-Open No. 02-283022 discloses a method for producing a semiconductor oxide film by conducting beat treatment in a gas atmosphere containing ozone. This technique is based on heat treatment, and besides, although the starting film is mainly amorphous, there is no mention of a technique for crystallizing the amorphous material. Also, it cannot necessarily be said that this relates to a plasma exposure technique. It is clearly different from the present invention.

Japanese Patent Laid-Open No. 11-145148 discloses an annealing method for irradiating a thin film deposited on a substrate with thermal plasma. This technique is clearly different from the present invention in that it uses high temperature plasma instead of low temperature plasma which is used in the present invention.

EXAMPLES

Example 1

A $TiO_2$ thin film prepared on glass using RF (radio frequency) magnetron sputtering was irradiated with oxygen plasma having a frequency of 13.56 MHz, amplification power of 300 W and an oxygen flow rate of 100 cc/minute for 1 hour to obtain a crystalline $TiO_2$ thin film. In particular, the exposure with oxygen plasma in a high frequency electric field was started at room temperature, and the plasma treatment was conducted for the above period of time without applying heat.

Comparative Example 1

A film was obtained in the same manner as that in Example 1, but without performing oxygen plasma treatment.

The films obtained in Example 1 and Comparative Example 1 were subjected to ultraviolet irradiation at an intensity of 1 mW using a black light to determine the contact angle change. The results are shown in FIG. 1. It shows that the contact angle was decreased by the ultraviolet irradiation, and the photo-inducted hydrophilicity was promoted by the oxygen plasma irradiation.

Example 2

In order to obtain a titanium oxide thin film, titanium alkoxide manufactured by Nippon Soda Co., Ltd. (NDH-510C) was deposited (a wet $TiO_2$ film) on a silicon wafer ((100) plane) by conducting a spin coating method for 20 seconds at 5000 rpm and dried in air at 120° C. The dried film was treated by ultraviolet rays having a wavelength of 253.7 nm for 1 hour with bubbled oxygen being flown into water of 60° C. at a flow rate of 300 cc/minute. Next, this was irradiated with oxygen plasma having a frequency of 13.56 MHz, amplification power of 300 W and an oxygen flow rate of 100 cc/minute (container pressure approx. 50 Pa) for 1 hour. The exposure with oxygen plasma in a high frequency electric field was also started at room temperature, and plasma treatment was conducted for the above period of time without applying heat.

Comparative Example 2

A film was prepared in the same manner as that in Example 2, but without performing oxygen plasma treatment.

Figure 2:
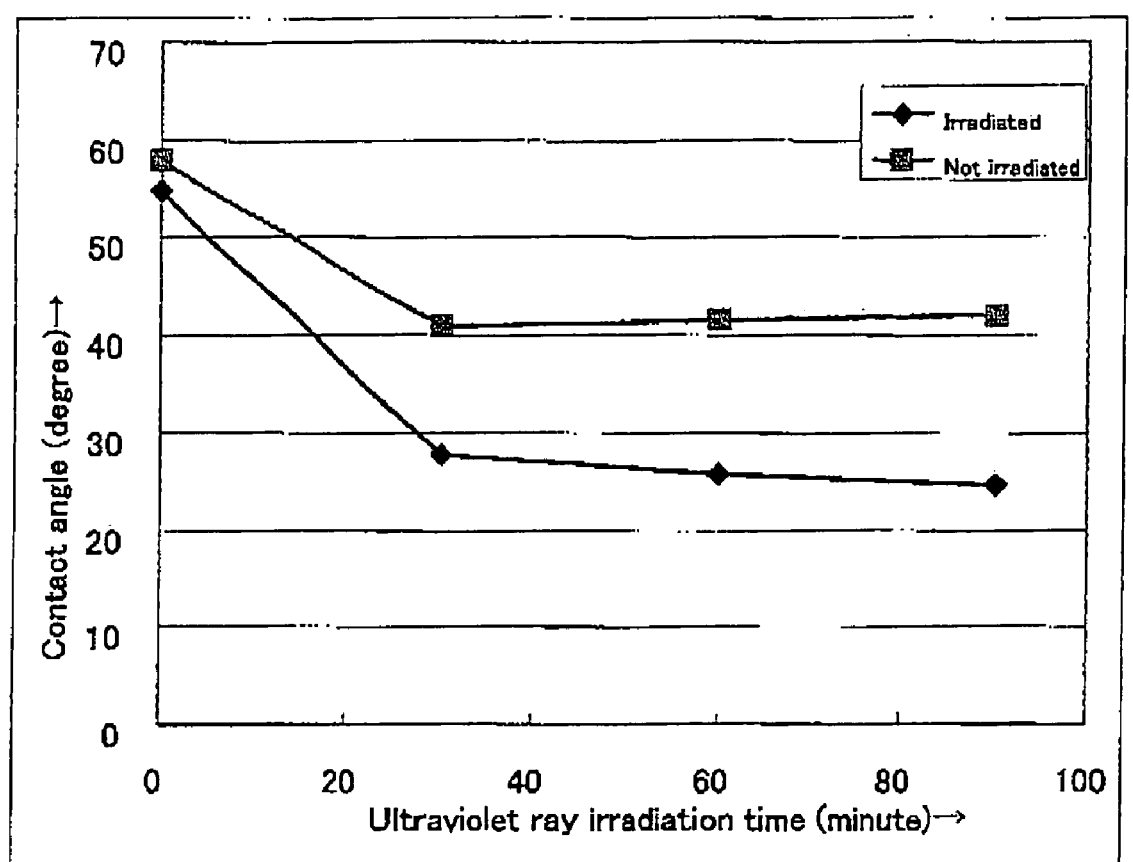
FIG. 2 shows a relationship between ultraviolet irradiation time and contact angle, which shows the effect of hydrophilicity when oxygen plasma treatment is carried out on an alkoxide film.
Figure 3:
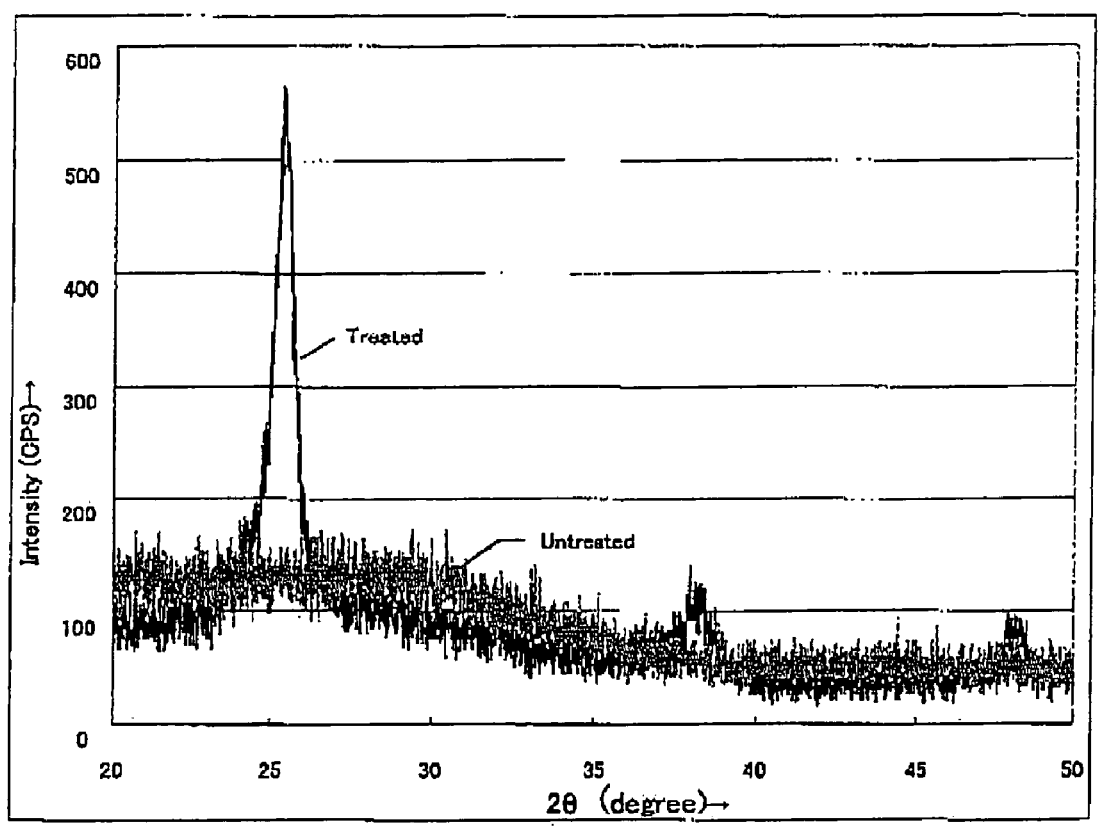
FIG. 3 is a characteristics diagram showing an X-ray diffraction pattern when oxygen plasma treatment is carried out on an alkoxide film.
Figure 4:
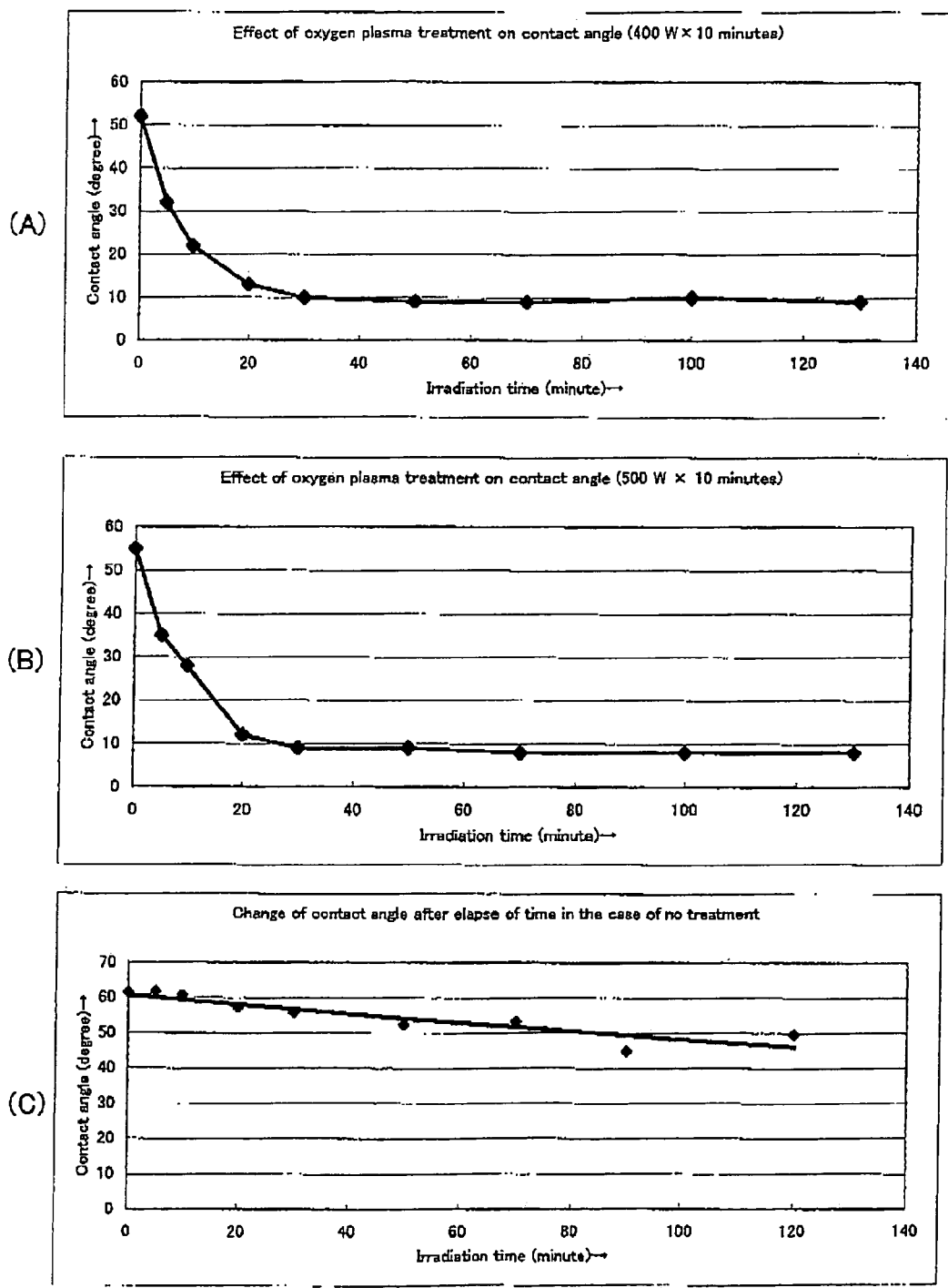
FIGS. 4(A) to 4(C) show relationship between irradiation time and contact angle, which show the effect of hydrophilicity when oxygen plasma treatment is carried out on an sputtered film.

The $TiO_2$ films obtained in Example 2 and Comparative Example 2 were subjected to ultraviolet irradiation at an intensity of 1 mW using a black light to determine the contact angle change. The results are shown in FIG. 2. It shows that the photo-inducted hydrophilicity was promoted by the oxygen plasma irradiation as in Example 1 and Comparative Example 1. In addition, FIG. 3 shows the X-ray diffraction pattern of an alkoxide film deposited in the same manner, but treated by oxygen plasma having an oxygen flow rate of 200 cc/minute (container pressure approx. 100 Pa). A peak indicating crystallization by the oxygen plasma treatment can be observed, from which it can be determined that this treatment formed a crystallized $TiO_2$ film from an alkoxide at room temperature.

Since the entire process is carried out at room temperature, the process is simple. Conditions such as the gas flow rate, bubbling conditions, supplied power and treatment time depend on the equipments. Where surface properties such as hyperhydrophilicity are evaluated as a film structure, sufficient results can be obtained by conducting the above process only once. However, in a case where it is necessary to confirm whether a film is crystallized or not such as a case of a surface cured film, it is possible to produce a thick film by repeating the above process multiple times to provide a layered structure.

Example 3

In order to obtain a titanium oxide thin film titanium alkoxide manufactured by Nippon Soda Co., Ltd. (NDH-510C) was deposited (a wet $TiO_2$ film on a silicon wafer ((100) plane) by conducting a spin coating method for 20 seconds at 5000 rpm and dried in air at 120° C. The dried film was treated by ultraviolet rays having a wavelength of 253.7 nm for 1 hour with bubbled oxygen being flown into water of 60° C. at a flow rate of 300 cc/minute. Next, this was irradiated with oxygen plasma having a frequency of 13.56 MHz, amplification power of 400 W and an internal pressure of 100 Pa for 10 minutes, Example 4

In order to obtain a titanium oxide thin film, titanium alkoxide manufactured by Nippon Soda Co., Ltd. (NDH-510C) was deposited (a wet $TiO_2$ film) on a silicon wafer ((100) plane) by conducting a spin coating method for 20 seconds at 5000 rpm and dried in air at 120° C. The dried film was treated by ultraviolet rays having a wavelength of 253.7 nm for 1 hour with bubbled oxygen being flown into water of 60° C. at a flow rate of 300 cc/minute. Next, this was irradiated with oxygen plasma having a frequency of 13.56 MHz, amplification power of 500 W and an internal pressure of 100 Pa for 10 minutes.

Comparative Example 3

A film was prepared in the same manner as those in Examples 3 and 4, but without performing oxygen plasma treatment.

The obtained $TiO_2$ films subjected to ultraviolet irradiation at an intensity of 1 mW using a black light to determine the contact angle change. The results are shown in FIGS.

Figure 5:
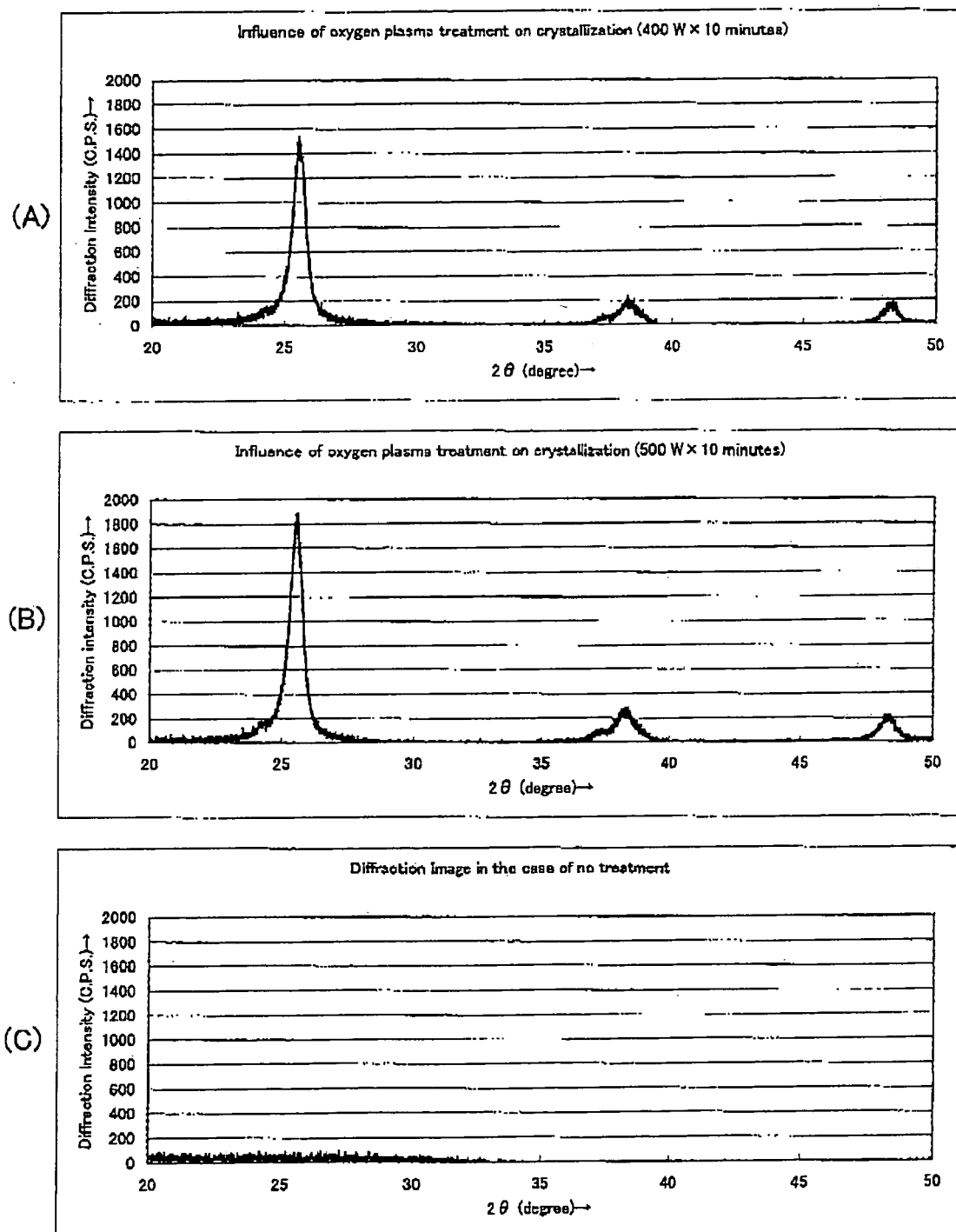
FIGS. 5(A) to 5(C) are characteristics diagrams showing an X-ray diffraction pattern when oxygen plasma treatment is carried out on an alkoxide film.
Figure 6:
FIG. 6 shows the observed results of Example 4 from a scanning electron microscope.

4(A) to 4(C). The X-ray diffraction patterns are shown in FIGS. 5(A) to 5(C). It shows that the contact angle was decreased by the ultraviolet irradiation, and the photo-inducted hydrophilicity was promoted by the oxygen plasma irradiation. A peak indicating crystallization by the plasma treatment can be observed, from which it can be determined that this treatment formed a crystallized $TiO_2$ film from an alkoxide at room temperature FIG. 6 shows a view observed by a scanning electron microscope of the $TiO_2$ film obtained in Example 4. From this view, it can be seen that particles having a size of approximately 10 nm are packed very uniformly and densely.

Comparative Example 4 (Reference Comparative Example 4)

A film prepared in the same manner as those in Examples 3 and 4 was irradiated with oxygen plasma under the same conditions as Examples 3 and 4, but without the step of treating for 1 hour by ultraviolet rays having a wavelength of 253.7 nm for 1 hour with bubbled oxygen being flown into water of 60° C. at a flow rate of 300 cc/minute. The results showed that the film was not crystallized nor cured, and cracks occurred in the entire surface. These results showed that the pretreatment by ultraviolet rays is effective under the deposition conditions in Examples 3 and 4.

Example 5

Figure 7:
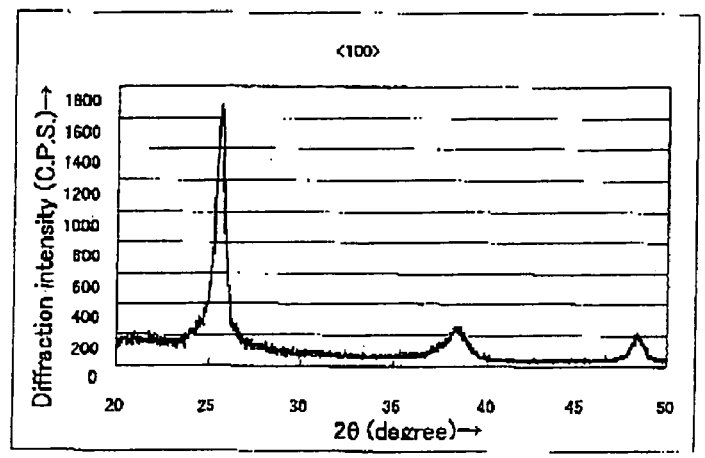
FIGS. 7(A) to 7(C) are characteristics diagrams showing the X-ray diffraction patterns of Example 5.
Figure 7:
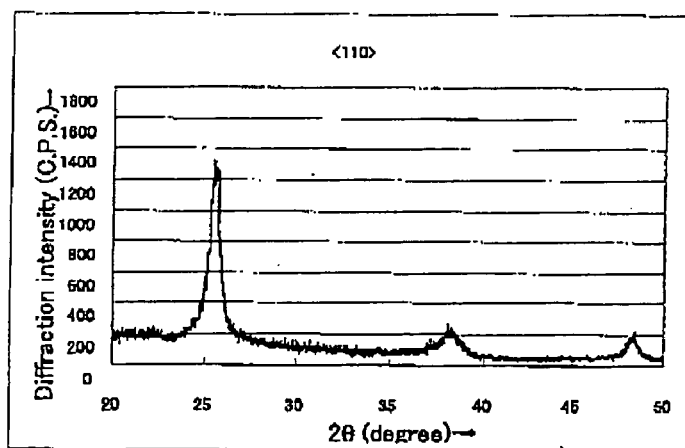
Figure 7:
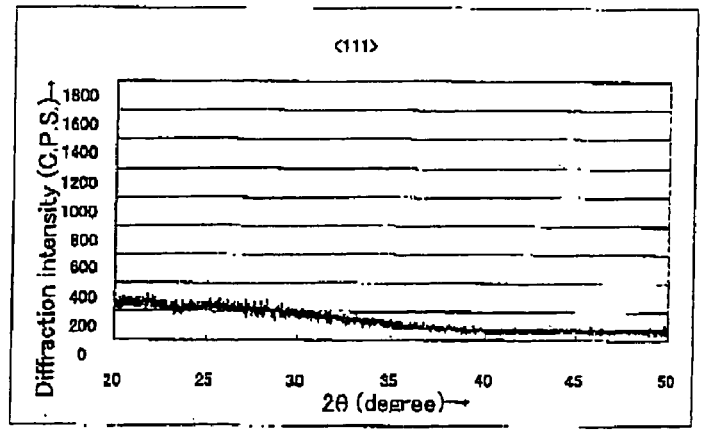

This example was conducted to confirm the dependency on an underlayer and the effects of a layered structure when a crystalline $TiO_2$ thin film is prepared from a wet $TiO_2$ film. In order to obtain titanium oxide, titanium alkoxide manufactured by Nippon Soda Co., Ltd. (NDH-510C) was deposited on silicon wafers ((100) plane; (110) plane; (111) plane) by conducting a spin coating method for 20 seconds at 5000 rpm (wet $TiO_2$) and dried in air at 120° C. The dried films were treated by ultraviolet rays having a wavelength of 253.7 nm for 1 hour with bubbled oxygen being flown into water of 60° C. at a flow rate of 300 cc/minute. Next, they were irradiated with oxygen plasma having a frequency of 13.56 MHz, amplification power of 300 W and an internal pressure of 50 Pa for 60 minutes. This process was repeated 3 times. The X-ray diffraction patterns of Example 5 are shown in FIGS. 7(A) to 7(C). The degree of crystallization depends on Miller indices of the silicon wafer. The 3-layered film had a total film thickness of about 200 nm, and no cracks or peeling from the boundaries of the layered structure were observed. Consequently, it is possible to produce a thick film by providing a layered structure.

Example 6

Figure 8:
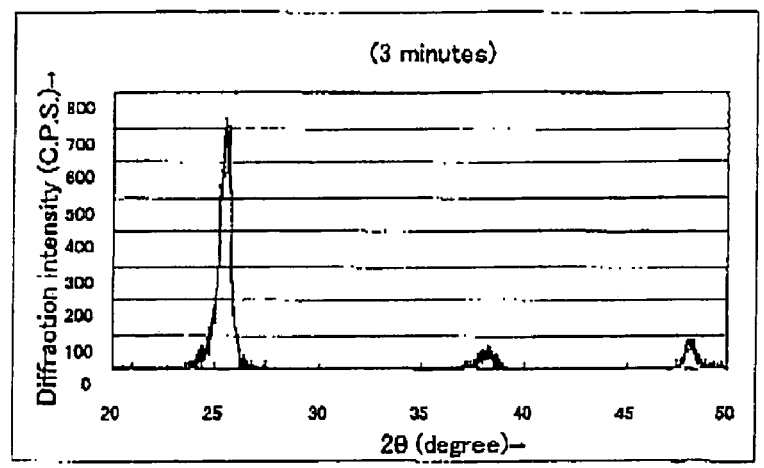
FIGS. 8(A) to 8(C) are characteristics diagrams showing the X-ray diffraction patterns of Example 6.
Figure 8:
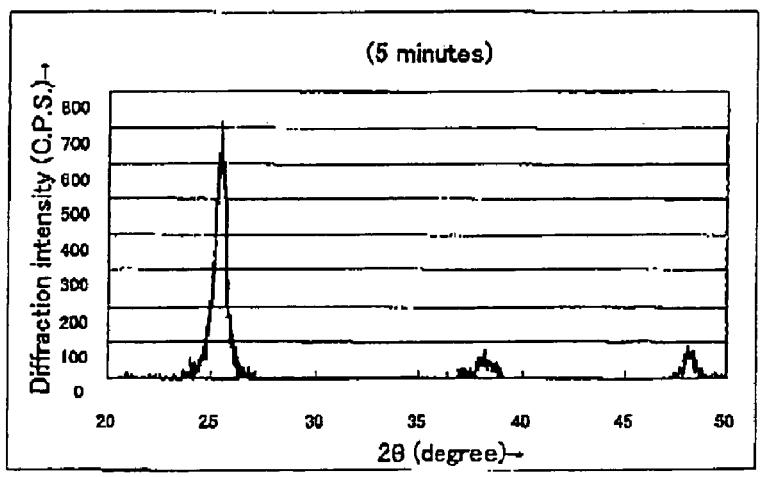
Figure 8:
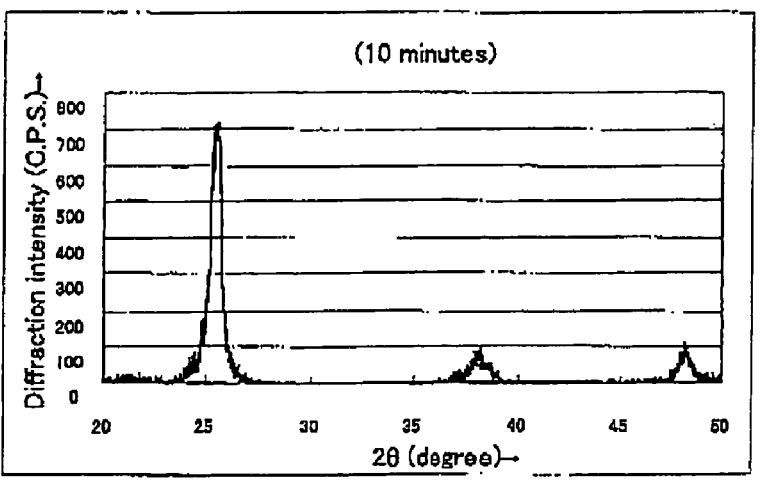
Figure 9:
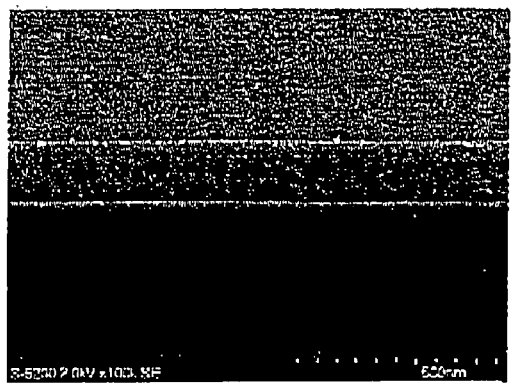
FIGS. 9(A) to 9(C) show the observed results of Example 6 from a scanning electron microscope.
Figure 9:
Figure 9:
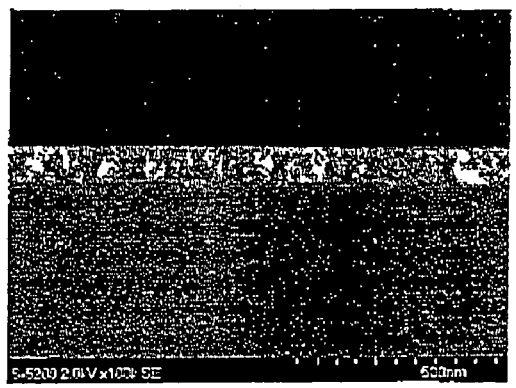
Figure 10:
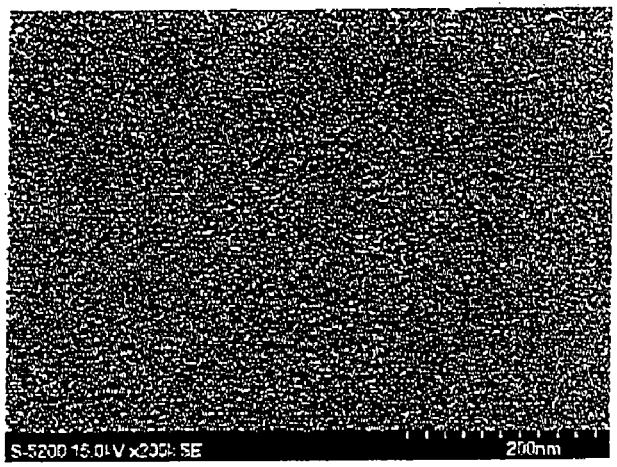
FIGS. 10(A) and 10(B) show the observed results of Example 6 from a scanning electron microscope when the results of burning and plasma treatment are compared.
Figure 10:
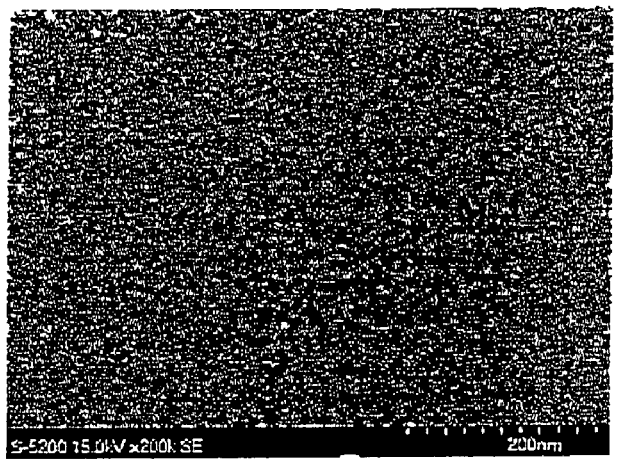
Figure 11:
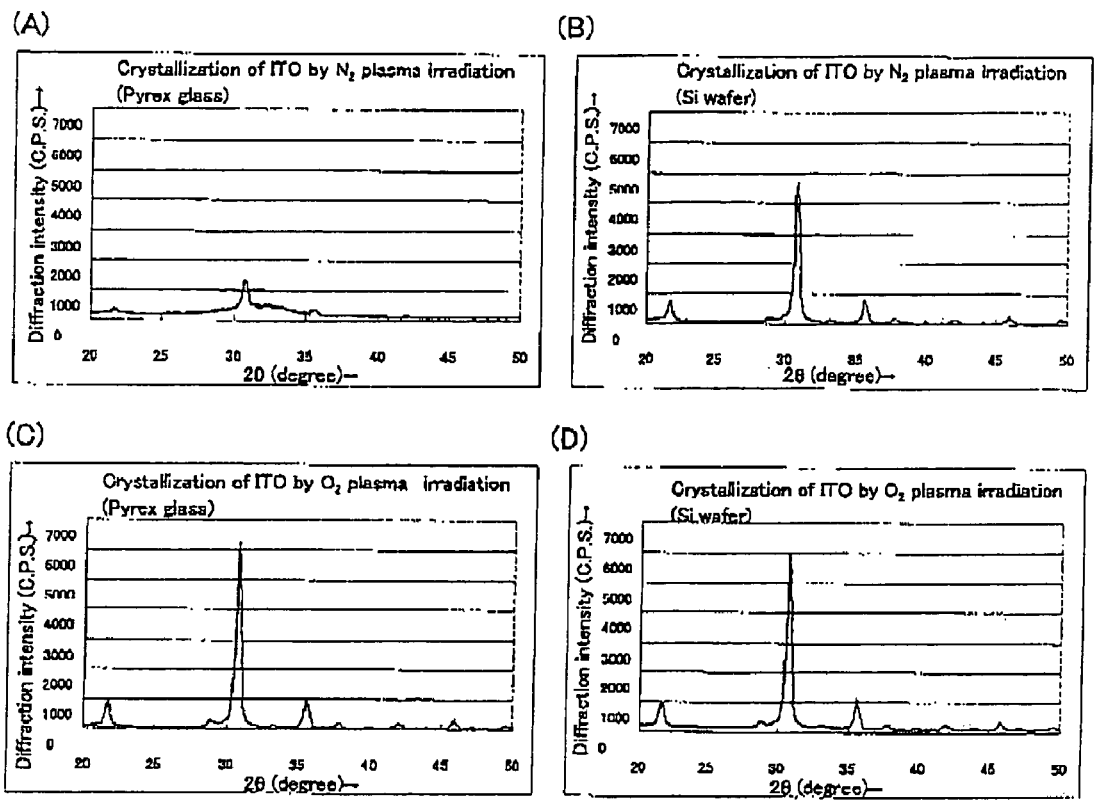
FIGS. 11(A) to 11(D) are characteristics diagrams showing the X-ray diffraction patterns of Example 8.

This example was conducted to confirm the effects of plasma treatment time. In order to obtain titanium oxide, titanium alkoxide manufactured by Nippon Soda Co., Ltd. (NDH-510C) was deposited on a silicon wafer ((100) plane) by conducting a spin coating method or 20 seconds at 3000 rpm (wet $TiO_2$) and dried in air at 120° C. The dried film was treated by ultraviolet rays having a wavelength of 253.7 nm for 1 hour with bubbled oxygen being flown into water of 60° C. at a flow rate of 300 cc/minute, Next, this was irradiated with oxygen plasma having a frequency of 13.56 MHz, amplification power of 550 W and an internal pressure of 100 Pa for 3 minutes, 5 minutes and 10 minutes, respectively. The X-ray diffraction patterns of Example 6 are shown in FIGS. 8(A) to 8(C). Cross-sectional views of the films observed with a scanning electron microscope are shown in FIGS. 9(A) to 9(C). It can be seen from the changes in the X-ray diffraction patterns and the film thickness that a large part of the crystallization had been finished after only 3 minutes elapsed. According to measurement with a thermo-label, the surface temperature was still about 80° C. when plasma irradiation was performed for 3 minutes, and the surface temperature was still about 180° C. when plasma irradiation was performed for 10 minutes. This shows that the crystallization was not caused by heat such as self-heating or external heating. The refractive index of the film which was treated for 10 minutes in Example 6 was evaluated by ellipsometry, and the refractive index was 1.88 before the plasma treatment was conducted, and 2.33 after the plasma treatment was conducted. In contrast, the refractive index of a similar film to that of Example 6 which was burned for 1 hour at 500° C. in air without conducting plasma treatment was 2.24. The X-ray diffraction patterns of these film are shown in FIGS. 10(A) and 10(B). While the film (A) which was crystallized by heat had a large number of crocks, the film (B) which was obtained by plasma treatment was dense and homogenous. Also, from the fact that the refractive index of anatase is 2.46, it was assumed that the film underwent the plasma treatment for 10 minutes in Example 6 had a relative density of 90% or more.

Example 7

This example was conducted to confirm the electrical properties and the homogeneity of a crystalline $TiO_2$ thin film produced from a wet $TiO_2$ film. First, platinum was deposited onto a silicon wafer ((100) plane). In order to obtain titanium oxide thereon, titanium alkoxide manufactured by Nippon Soda Co., Ltd. (NDH-510C) was deposited by conducting a spin coating method for 20 seconds at 3000 rpm and dried in air at 120° C. The dried film was treated by ultraviolet rays having a wavelength of 253.7 nm for 1 hour with bubbled oxygen being flown into water of 60° C. at a flow rate of 300 cc/minute. This was irradiated with oxygen plasma having a frequency of 13.56 MHz, amplification power of 550 W and an internal pressure of 100 Pa for 10 minutes. Approximately 20 metal titanium electrodes having an edge of 5 mm were formed independently on the obtained titanium oxide thin film and the dielectric constant of the film was measured. The dielectric constant was about 37 at a measuring frequency of 1 MHz. This value corresponds with the well-known dielectric constant of anatase. The elements were formed so as to have a 5 mm edge, and no interelectrode leakage was observed with respect to the approximately 200 elements irrespective of the extremely thin film thickness (approx. 100 nm). This shows that the film was crystallized and densified extremely homogeneously, and also this corresponds with the measurement results with a scanning electron microscope in Example 6 quite well.

Example 8

This example was conducted to confirm the dependency on plasma and the dependency on an underlayer of a metal oxide thin film produced from sputtering ITO. ITO was deposited in an amount of about 150 nm on Pyrex and a silicon wafer ((100) plane) at room temperature, and thereafter irradiated with oxygen plasma or nitrogen plasma having a frequency of 13.56 MHz, amplification power of 550 W and an internal pressure of 100 Pa for 10 minutes. The X-ray diffraction patterns of Example 8 are shown in FIGS. 11(A) to 11(D). Although the degree of crystallization varies, crystallization occurred by both oxygen plasma and nitrogen plasma, and the degree of the crystallization depends on the type of plasma and the substrate.

Example 9

Figure 12:
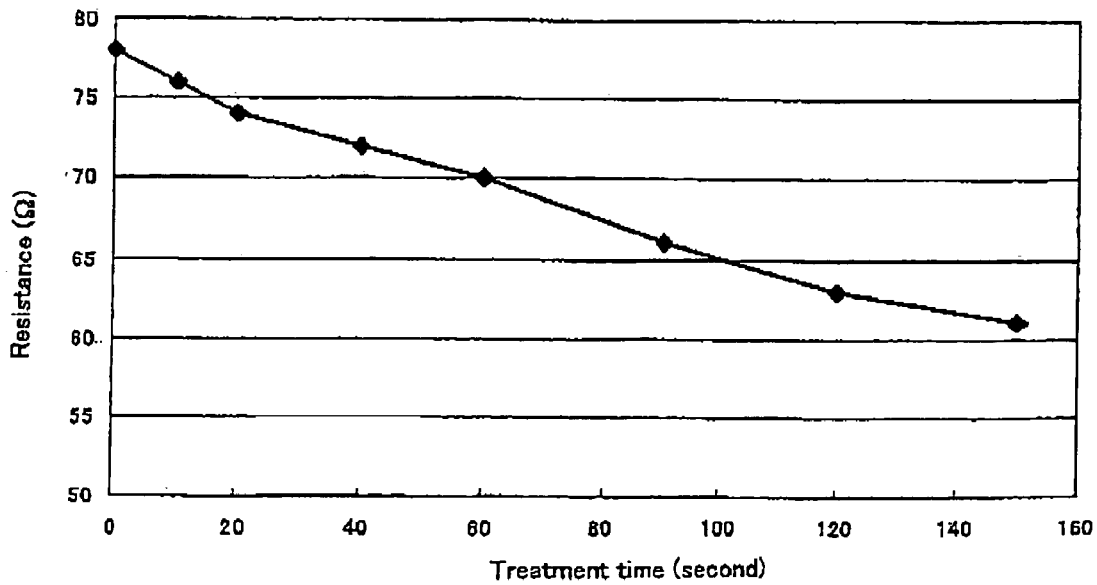
FIG. 12 is a characteristics diagram of the resistance change of Example 9.

An ITO amorphous thin film was deposited by sputtering onto a polyethylene terephthalate film having a thickness of 50 μm at room temperature in mixed gas of argon gas of 295 CCM and oxygen gas of 5 CCM having a total pressure of 0.6 Pa, under conditions of a frequency of 13.56 MHz and amplification power of 1.5 KW, and oxygen plasma treatment was carried out under conditions of a frequency of 13.56 MHz, oxygen gas of 400 CCM, amplification power of 400 W and an internal pressure of 33 Pa. The graph of the resistance change in Example 9 is shown in FIG. 12. The graph shows that the resistance decreased almost straightly. In spite of the substrate which is extremely susceptible to heat (glass transition temperature; 90° C.), no deformation, cloudiness or the like was observed, and the external appearance was the same as that of the state where the treatment was carried out. Consequently, it is assumed that this process has the good effect of reducing a resistance value even though this process was a small thermal charge process.

The samples, conditions and results with respect to the test of crystallization in the above processes according to the present invention are shown in Table 1.

Since all the processes according to the present invention are carried out at room temperature, they are simple. Regarding the film structure, good results can be obtained by conducting the above process only once in a case where surface properties such as hyperhydrophilicity are evaluated. However, a thick film can also be produced by repeating the above process multiple times so as to provide a layered structure.

TABLE 1

| Substance | Deposition method | Substrate | Plasma type | Presence of crystallization |
|---|---|---|---|---|
| ITO | sputtering | Glass | oxygen | ○ |
| ITO | sputtering | Glass | nitrogen | Δ |
| ITO | sputtering | Si<100> | oxygen | ○ |
| ITO | sputtering | Si<100> | nitrogen | ○ |
| PbO$_2$ | sol-gel | Si<111> | oxygen | ○ |
| PZT | sol-gel | Si<111> | oxygen | Δ |
| Soda-lime glass | sputtering | Si<111> | oxygen | x |
| Al$_2$O$_3$ | sol-gel | Glass | oxygen | x |
| Al$_2$O$_3$ | sol-gel | Si<100> | oxygen | x |
| TiO$_2$ | sputtering | Glass | oxygen | ○ |
| TiO$_2$ | sol-gel | Glass | oxygen | x |
| TiO$_2$ | sol-gel | Si<100> | oxygen | ○ |

As explained above, by the process for producing a metal oxide thin film according to the present invention, a crystalline metal oxide thin film can be effectively formed on various substrates without requiring heating. This process overcomes the drawbacks of the conventional process and pioneers a new path for ta process for producing a thin film.

INDUSTRIAL APPLICABILITY

A method for producing a metal oxide thin film according to the present invention can effectively form a dense and homogenous crystalline metal oxide thin film on a substrate at a low temperature without requiring active heat treatment. Accordingly, a metal oxide thin film having desired characteristics can be formed without damage to the characteristics of the substrate even if the substrate has a relatively low heat resistance. Consequently, the present invention can be applied, in particular, to all cases where a metal oxide thin film needs to be formed on a substrate having a low heat resistance such as resin.

The invention claimed is:

1. A method for producing a crystalline metal oxide thin film comprising a step of exposing a substantially amorphous metal oxide film to low temperature plasma in a high frequency electric field at a temperature of 180° C. or less, wherein the crystalline metal oxide thin film has a relative density of 90% or more with respect to a theoretical density.

2. The method for producing a crystalline metal oxide thin film according to claim 1, wherein the crystalline metal oxide thin film consists of a substantially crystalline metal oxide thin film.

3. The method for producing a crystalline metal oxide thin film according to claim 1, wherein high frequency plasma is used for the low temperature plasma.

4. The method for producing a crystalline metal oxide thin film according to claim 3, wherein conditions for generating the low temperature and high frequency plasma includes a applied frequency of 1 kHz to 300 MHz, a pressure of 5 Pa or more and a supplied power of 300 W or more.

5. The method for producing a crystalline metal oxide thin film according to claim 1, wherein the low temperature plasma is plasma generated by exciting gas which comprises at least oxygen gas or an oxygen element.

6. A method for producing a crystalline metal oxide thin film comprising a step of exposing a substantially amorphous metal oxide film to low temperature plasma in a high frequency electric field at a temperature of 180° C. or less, wherein the metal oxide thin film is a film whose properties are imparted by the deficiency of oxygen, and the low temperature plasma is plasma generated by exciting gas which comprises at least argon gas or nitrogen gas or both.

7. The method for producing a crystalline metal oxide thin film according to claim 1, wherein the substantially amorphous metal oxide film is formed by any one of a sputtering method, an ion plating method and a vacuum deposition method.

8. A method for producing a crystalline metal oxide thin film comprising a step of exposing a substantially amorphous metal oxide film to low temperature plasma in a high frequency electric field at a temperature of 180° C. or less, wherein the substantially amorphous metal oxide film is formed by applying a precursor solution.

9. The method for producing a crystalline metal oxide thin film according to claim 8, wherein ultraviolet rays irradiation is conducted in the presence of water vapor to the substantially amorphous metal oxide film formed by the application of a precursor solution prior to exposure to the plasma.

10. The method for producing a crystalline metal oxide thin film according to claim 1, wherein the substantially amorphous metal oxide film comprises titanium oxide.

11. The method for producing a crystalline metal oxide thin film according to claim 1, wherein the substantially amorphous metal oxide film comprises ITO.

12. The method for producing a crystalline metal oxide thin film according to claim 1, wherein the substantially amorphous metal oxide film comprises lead zirconate titanate.

13. A method for producing a crystalline metal oxide thin film comprising a step of exposing a substantially amorphous metal oxide film to low temperature plasma in a high frequency electric field at a temperature of 180° C. or less, wherein the crystalline metal oxide thin film is formed on a non-heat resistant substrate without an intermediate heat barrier layer.

14. A method for producing a crystalline metal oxide thin film comprising a step of exposing a substantially amorphous metal oxide film to low temperature plasma in a high frequency electric field at a temperature of 180° C. or less, wherein a photocatalytic material has the crystalline metal oxide thin film as a surface layer and/or an internal layer.

* * * * *